United States Patent [19]

Kohtani

[11] 4,134,079
[45] Jan. 9, 1979

[54] AUTOMATIC GAIN CONTROL CIRCUIT FOR SOUND MOTION PICTURE CAMERA

[75] Inventor: Yutaka Kohtani, Yokohama, Japan

[73] Assignee: Canon Kabushiki Kaisha, Tokyo, Japan

[21] Appl. No.: 820,259

[22] Filed: Jul. 29, 1977

[30] Foreign Application Priority Data

Jul. 30, 1976 [JP] Japan ............................. 51-91097

[51] Int. Cl.² ................................................ H03G 3/30
[52] U.S. Cl. ............................... 330/281; 330/141; 330/284
[58] Field of Search ....................... 325/404, 410, 413; 330/141, 281, 284

[56] References Cited

U.S. PATENT DOCUMENTS 3,790,896  2/1974  Shimizu ............................. 330/281

Primary Examiner—Lawrence J. Dahl
Attorney, Agent, or Firm—Toren, McGeady and Stanger

[57] ABSTRACT

A sound motion picture camera with sound recording equipment rendering it possible to record sound accompaniments by way of a magnetic track on the picture film and provided with an automatic gain control circuit operating with attack and recovery times automatically controlled in accordance with variation of the dynamic range of the sound accompaniment.

16 Claims, 4 Drawing Figures

AUTOMATIC GAIN CONTROL CIRCUIT FOR SOUND MOTION PICTURE CAMERA

BACKGROUND OF THE INVENTION

1. Field of the Invention

This invention relates to sound motion picture cameras which utilize photographic film with a magnetic track in recording sound accompaniments for motion pictures, and, more particularly, to an automatic gain control circuit in a sound recording circuit adapted for use with such camera.

2. Description of the Prior Art

Recently, a new type of sound motion picture camera (particularly in the field the 8mm camera art) has appeared on the market which is characterized by use of a composite recording medium consisting of a photographic roll film on which a track of magnetic material is applied for sound recording. This type camera makes use of a recording circuit of construction well known in the tape recorder art. In more detail, such recording circuit is constructed to include an amplifier circuit responsive to a sound signal from a microphone for producing an output signal with a bias signal is applied to a magnetic head with action on the magnetic track. In order to maintain the responsibility of the amplifier circuit at a proper level, it is required to achieve satisfactory gain control either manually or automatically. Because of extreme difficulty of manual gain control in sound motion picture cameras particularly with respect to 8mm cameras, the use of automatic gain control circuit is widely accepted.

Typical of such conventional automatic gain control circuits in the field of the tape recorder art is that shown in FIG. 1, wherein a sound signal from a microphone appears at an input terminal 1, and, after having been attenuated in a ratio of a fixed impedance which may be in the form of a resistor 2 to a variable impedance which may be in the form of a transistor 3, is amplified by an amplifier 4 having an output terminal 4. An automatic gain control circuit for such amplifier circuit is shown as comprising a resistor 6, a capacitor 8 connected through a diode 7 in series to the resistor 6 and to the output terminal 5 of the amplifier 4, and a resistor 9 connected in series to the capacitor 8 at one end thereof, the opposite end of which is connected to the base electrode of the transistor 3, so that the impedance of the transistor 3 is varied depending upon the output of the amplifier 4. When the level of input signal at the terminal 1 becomes higher, therefore, the impedance of the variable impedance element 3 is made the smaller, while when becomes lower, it is made the larger, the resulting output level of the amplifier 4 being maintained constant.

With this automatic gain control circuit, the response time from the moment when a large input signal starts to appear at the input terminal 1 to the moment when a gain control procedure is terminated at a value smaller than the initial one, termed "attack time," is controlled by the resistor 6 and the capacitor 8. On the other hand, the recovery time from the moment when the large input signal disappears to the moment when the gain takes the initial value as it increases is controlled by the capacitor 8, the resistor 9 and the base impedance of the transistor 3. In general, the conventional tape recorders are designed to operate with attack and recovery times specified by taking into account the following facts. If the attack time is too long, sound recording tends to be distorted at the start so that it is preferred that the attack time be reduced to as short a value as possible, but, if the reduction is too much, an instantaneous sound such as a click will cause accidental actuation of the gain control circuit, thus the commonly accepted value of the attack time is on the order of 0.1 second. On the other hand, the recovery time is associated with more difficult aspects in determining a single value than those of the attack time, since the required value of the recovery time depends upon what kind of sound of principle interest is to be recorded. For example, that type of tape recorder which is adapted to record music sound must be operated over a wide dynamic range, or otherwise music will be recorded with a considerable loss in rhythm. In addition thereto, as the music recordings generally continue for a long period of time, the recovery time is required to be as long as possible, usually on the order of 2 to 3 minutes. In contrast to the music recorder, the conversation recorder, because of its aiming at providing the clarity of voices rather than the assurance of a wide dynamic range, is designed to have a comparatively short recovery time of about 2 to 3 seconds, thereby it being made possible to record loud and low voices at almost the same level.

As far as almost all of the tape recorders are concerned, there is no need to employ automatic control of the attack and recovery times in performing sound recordings. This is because the music recorder when rendered cooperative with a sound source having a previously narrowed dynamic range such as a radio, tuner, television set and sound reproducing apparatus without recourse to a microphone will take sound recordings of sufficiently good quality, provided that the selected value of the recovery time is adequately long. When a sound such as music in live performance is desired to be recorded directly from the microphone, in other words, when a sound having a wide dynamic range is to be recorded over that wide dynamic range, use will be made not of the automatic gain control circuit, but of a VU meter by which manual adjustment of sound level is performed to obtain high quality sound recordings. This is because the operator is permitted to focus his attention on the sound recording control and because such manual control leads to a higher possibility of achieving satisfactory results. Where there is no need to secure a wide dynamic range as in conversation recordings, or when loud and low voices are desired to be recorded at almost the same level, a satisfactory result can be secured by adjusting the recovery time to a small value. Besides these types of tape recorders, it is known to provide an alternate type of tape recorder having manually selective control of recovery time.

In recording sound accompaniments for motion pictures, as the photographer is obliged to focus a large proportion of his attention on the motion picture taking, it is difficult to perform manual control of sound level, and therefore, it is preferred to make use of an automatic gain control circuit. When the live sound recording passes through a microphone for the motion picture, and since the music and conversation accompanied with the motion picture and other various sounds present have a wide dynamic range, it becomes very difficult to select a proper value of the recovery time for employment in the automatic gain control circuit. The attack time, however may be adjusted to 0.1 second or less by taking into account the occurrence of distortion in the sound recording at the start in a fashion similar to that of the tape recorder.

In an 8mm camera, for example, each magazine containing a roll film of 50 feet long can take a continuous series of motion picture frames at a film speed of 18 frames/sec. for about 3 minutes and 16 seconds. As the film is intermittently advanced at the picture taking station, production of noise takes place, causing difficulty in incorporating the microphone within the camera housing, so that the microphone must be separate from the camera. (In the case of the tape recorder, because of a low level of the noise resulting from the tape driving, the microphone is not necessarily separate from the tape recorder.) For these reasons, if the recovery time is as long as 2 to 3 minutes, a loud sound followed by low sound can be recorded in a corresponding dynamic range for providing an impression of far and near distance, as the long recovery time assures the maintenance of the gain unchanged at a small value. Even when the sound recordings are performed in a noisy environment, it is possible to reduce the noise relative to the sound of principal interest provided that this sound is sufficiently large. However, when a crashing sound is given to the microphone as by tapping the microphone on a solid body, the gain is later maintained at a reduced value for 2 to 3 minutes so that it is impossible to record the sound of principal interest at a proper level. In a case where an unnecessary large sound occurs at the start of sound-accompanied motion picture taking sequence, all the recording with one magazine cannot be made under proper conditions. On the other hand, if the recovery time is about 2 to 3 seconds, the reduction of the gain caused by a large sound is rapidly compensated for in the subsequent recording of small sound, thus the sound recording is not seriously affected by the crashing sound. Because of the rapid retaining of the gain, a small sound after a large sound is recorded at almost the same level as that of the latter, so that the later reproduction will give the motion picture viewer an impression of almost no far and near distance sense. When the sound recording is performed in a noisy environment, the later sound reproduction will give the viewer a noise-accelerated impression. In the motion pictures with simultaneous reproduction of the sound accompaniments, it is of importance to establish proper relationship between the motion picture and the sound accompaniment. Sound reproduction with lack of far and near sense and of the close-up of the sound of principal interest and with the prominance of noise and the lack of correct control of the sound level will give the motion picture viewer a particularly unpleasant impression.

SUMMARY OF THE PRESENT INVENTION

An object of the present invention is to provide an automatic gain control circuit optimized for use in a sound motion picture camera of the type described.

Another object of the invention is to provide an automatic gain control circuit for a cine-camera of which the recovery time is automatically varied with variation in spectrum of sound to be recorded.

Another object of the invention is to provide an automatic gain control circuit in which, when a sound is applied for a short time, the recovery time becomes shorter while when a larger sound is applied for a relatively long time, the recovery time becomes longer.

These and other objects of the invention will become apparent from the following detailed description of preferred embodiments of the invention taken in conjunction with the accompanying drawings.

DESCRIPTION OF THE PREFERRED EMBODIMENTS

Figure 1:
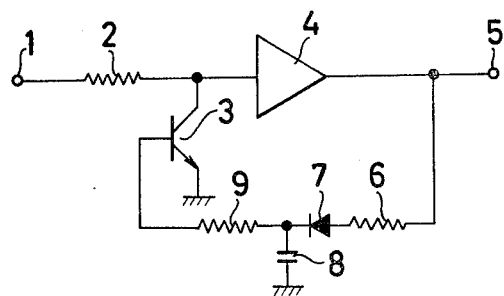
FIG. 1 is a diagram of an example of the conventional automatic gain control circuit.
Figure 2:
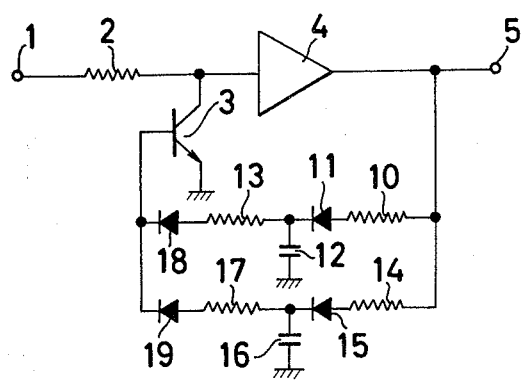
FIG. 2 is a diagram of one embodiment of an automatic gain control circuit according to the present invention associated with an amplifier circuit for use in a sound motion picture camera.

In FIG. 2, the amplifier circuit comprises an input terminal 1, a resistor 2 serving as a fixed impedance element, a transistor 3 as a variable impedance element, an amplifier 4 having an input terminal connected both to the resistor 2 and to the collector electrode of the transistor 3 with its emitter electrode grounded, and an output terminal 5 at which the output lead of the amplifier 4 terminates.

The automatic gain control circuit of the invention may conveniently be considered as comprising first and second sections similar to each other in construction and arrangement of the components. The first automatic gain control circuit section comprises a first resistor 10, a diode 11 having an anode connected through the resistor 10 to the output of the amplifier 4, a capacitor 12 connected to the cathode of the diode 11 at one pole, the opposite pole of which is grounded, a second resistor 13 connected to a point on connection between the diode 11 and the capacitor 12 at one end thereof, the opposite end of which is connected through a diode 18 to the base electrode of the transistor 3. The first resistor 10 and the capacitor 12 constitute a time constant circuit for determining a first attack time, and the impedance between the base and emitter of the transistor 3, the second resistor 13 and the capacitor 12 constitute a time constant circuit for determining a first recovery time. The required value of the first attack time is very short, for example, 0.1 second or less. The required value of the first recovery time is short as compared with the tape recorder, for example, 2 to 3 seconds.

The second automatic gain control circuit section comprises a first resistor 14 connected to the output of the amplifier 4 by way of a common lead of the first circuit section, a capacitor 16 with its one pole grounded and with its opposite pole connected both to the first resistor 14 through a diode 15 and to a second resistor 17, and a diode 19 having an anode connected to the second resistor 17 and having a cathod connected to the base electrode of the transistor 3 by way of a common lead of the first circuit section. The first resistor 14 and the capacitor 16 constitute a time constant circuit for determining a second attack time. The impedance between the emitter and base of the transistor 3, the second resistor 17 and the capacitor 16 constitute a time constant circuit for determining a second recovery time. The required value of the second attack time is considerably longer than that of the first attack time, for example, 20 to 30 times that of the first attack time, namely, 2 to 3 seconds. The required value of the second recovery time for a speed of 18 frames/sec. with a magazine containing a film of 50 feet long is also 20 to 30 times that of the first recovery time, namely, 60 to 90 seconds.

The operation of the circuit of FIG. 2 is as follows: Let us now assume that a sound signal of high level with a duration of about 1 second has suddenly arrived at the input terminal 1, then this signal, after being hardly damped by the resistor 2 and the transistor 3 because of the large collector-emitter impedance of the transistor 3, is applied to the amplifier 4. The amplified signal from the amplifier 4 appears at the output terminal 4, and, at the same time, is supplied to the first two resistors 10 and 14. The signal emanating from the resistor 10 is rectified by the diode 11 and then accumulated on the capacitor 12 in the form of a time variable voltage at a ramp of very steep slope because the time constant of the resistor 10 and the capacitor 12 is very short, that is, 0.1 second or less. As the voltage on the capacitor is applied through the second resistor 13 and the diode 18 to the base of the transistor 3, upon attainment of the voltage to a critical level for the transistor 3, the impedance between the collector and emitter of the transistor 3 is lowered to take a value suited for sound recording with distortion at minimum. In other words, as soon as a sound signal of high level appears at the input terminal 1, the first automatic gain control circuit section attacks the amplifier circuit so that the gain is reduced while ensuring that the distortion is minimized.

On the other hand, the signal supplied from the amplifier 4 to the resistor 14 is rectified by the diode 15 and then stored on the capacitor 16. As described above, the time constant of the resistor 15 and the capacitor 16 is relatively long for the attack time, that is, 2 to 3 seconds so that the high signal of duration of about 1 second does not result in actuation of the transistor 3, as the voltage of the capacitor 16 is applied through the second resistor 17 and the diode 19 to the base of the transistor 3. Thus, the second automatic gain control circuit section is left ineffective for that sound signal provided that the duration is shorter than 2 to 3 seconds.

Assuming further that such high sound signal of relative short duration is followed by a relatively low sound signal, the gain is capable of reaching the initial level during a time interval of about 2 to 3 seconds as determined by the time constant of the capacitor 12, the resistor 13 and the base-emitter impedance of the transistor 3. After the termination of duration of the second attack time (2 to 3 seconds) from the advent of the high level sound signal, the gain of the circuit starts again to be controlled by the first and second automatic gain control circuit sections. Therefore, even when a crashing sound, which may result from accidental tapping of the microphone, takes place at the start of a sound-accompanied motion picture sequence, the gain does not continue to be affected for so long by such crashing sound, but, soon after, sound of principal interest can be recorded at a proper level.

Alternately assuming that a sound signal of high level suddenly takes place for a relatively short time, beginning at a point during the sequence of sound of relatively low level, and that, after that, a sound signal of relatively low level follows, the gain control proceeds in a similar manner to that described above so that the first automatic gain control circuit section plays almost the leading role in gain control for the second signal of high level with relatively short duration, and that the shorter recovery time is automatically selected. Therefore, after a crashing sound has occurred at the microphone, the sound of principal interest can be recorded at a proper level without large delay.

Let us now assume that a sound signal of relatively high level with relatively long duration of about 5 to 10 seconds is followed by a sound signal of relatively low level with an elongated duration which is then followed by a sound signal of relatively high level. Such sequence of sound signals is, in many cases, desired to be recorded in a wide dynamic range. In this case, the signal of high level applied on the input terminal 1 is hardly damped by the resistor 2 and the transistor 3 because the collector-emitter impedance of the transistor 3 is large at the start of the signal. This signal is amplified by the amplifier 4 and the amplified signal appears at the output terminal 5 and is supplied to the resistors 10 and 14. The signal supplied to the resistor 10 is rectified by the diode 11 and then starts to charge the capacitor 12. As described before, the time constant of the resistor 10 and capacitor 12 is very short, for example, 0.1 second or less, so that in a very short time the D.C. current potential of the capacitor 12 arises. This potential is applied through the resistor 13 and diode 18 to the base of the transistor 3, thereby the transistor 3 is rendered effective with some loss in the collector-emitter impedance of the transistor 3. In other words, as soon as the sound signal of high level is applied, the first automatic gain control circuit section starts to operate with the resulting gain being adjusted to a level suited for minimizing distortion.

On the other hand, the signal supplied to the resistor 14 is rectified by the diode 15 and then starts to charge the capacitor 16. As described before, the time constant of the resistor 14 and the capacitor 16 is relatively long for the attack time, on the order of about 2 to 3 seconds, but the sound signal of high level lasts for a relatively long time. At the termination of duration of the second attack time, the D.C. current potential of the capacitor 16 arises. As the potential of the capacitor 16 increases, it is applied through the resistor 17 and the diode 19 to the base of the transistor 3, thereby the collector-emitter impedance of the transistor 3 is controlled in cooperation with the first automatic gain control circuit section, with the resulting output at the output terminal 5 being controlled at a proper level.

After the relatively long duration of the sound signal of the high level, a sound signal of relatively low level is applied. In a certain elongated time, the charge stored on the capacitor 16 causes increase of the gain, lasting for a long time, for example, of 60 to 90 seconds or the second recovery time as determined by the time constant of the resistor 17, the capacitor 18, and the base-emitter impedance of the transistor 3. For this reason, the sound signal of low level can be recorded in a lowered level. It is to be noted here that the charge stored on the capacitor 12 tends to discharge according to the first recovery time determined by the time constant of the capacitor 12, the resistor 13 and the base-emitter impedance of the transistor 3, but because of the long second recovery time, the base potential of the transistor 3 is determined by the second automatic gain control circuit, so that the discharging of the capacitor 12 occurs during the second recovery time.

After that, a sound signal of high level is applied again, the gain starts to be controlled by the first and second automatic gain control circuit sections.

In other words, when the duration time of the input signal of relatively low level is shorter than the second recovery time, the gain remains almost unchanged, so that the level of sound recorded corresponds to the level of the input signal. Therefore, it is made possible to perform sound recording over a wide dynamic range, and to provide an impression of far and near distance in the later reproduction.

Next, when sounds of almost the same level take place in sequence, the first and second automatic gain control circuit sections are rendered operative in parallel so that the shorter attack time and the longer recovery time are automatically selected. This will be readily understandable from the foregoing description.

Figure 3:
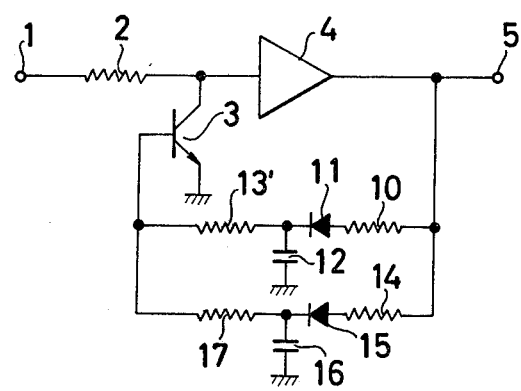
FIG. 3 is a similar diagram showing another embodiment of the invention.

The diodes 18 and 19 of FIG. 2 serve to minimize the interference between the first and second automatic gain control circuit sections and to make easier the circuit design with respect to the calculation of the first recovery time, the second attack time and the second recovery time. Therefore, these diodes 18 and 19 may be omitted as shown in FIG. 3 without sacrificing the equivalent effect to that of FIG. 2.

It will be seen from the foregoing that the present invention provides an automatic gain control circuit having automatically selective control of the attack and recovery times in such a manner that when a sound signal of high level with a short duration is applied, a short recovery time is selected; when a sound signal of high level with a relatively long duration is applied, a long recovery time is selected; when an unnecessary sound signal is suddenly applied on the microphone, sound of principal interest can be soon recorded at a proper level; when sound recording is performed in noisy environment, a sound of principal interest can be recorded with reduced noise provided that the sound is sufficiently large; and it is possible to record sound with sufficient rhythm. Where live sound presented together with picture is desired to be recorded more naturally, the automatic gain control circuit of the invention is most suited for use in a sound motion picture camera of the type in which one period of recording time is shorter than that of the ordinary tape recorder, and the provision of the automatic gain control circuit is indispensable because of difficulty of recording control for sound-accompanied motion picture sequence.

Figure 4:
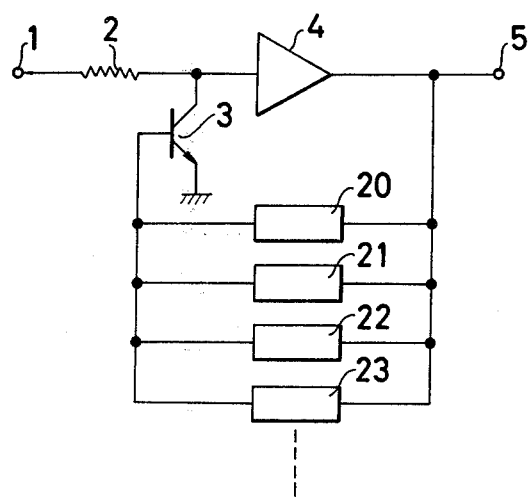
FIG. 4 is a diagram, partly in block form, of a generalized embodiment of the automatic gain control circuit according to the present invention.

In the above mentioned embodiments of the invention, the automatic gain control circuit is constructed as comprising two sections. But, as shown in FIG. 4, additional third and fourth sections having different attack and recovery times may be employed to achieve further improvement of the automatic gain control circuit.

What is claimed is:

1. An automatic gain control circuit for a camera which records sound with picture comprising:
  (a) amplifier means for amplifying a received sound;
  (b) a first time constant circuit including a first capacitor connected to the output terminal of said amplifier means, wherein said first time constant circuit forms a charge path of said first capacitor for determining a first attack time;
  (c) a first time constant element connected to said first capacitor for forming a discharge path of said first capacitor, wherein said first time constant element determines a first recovery time;
  (d) a second time constant circuit including a second capacitor connected to the output terminal of said amplifier, wherein said second time constant circuit forms a charge path of said second capacitor for determining a second attack time;
  (e) a second time constant element connected to said second capacitor for forming a discharge path of said second capacitor, wherein said second time constant element determines a second recovery time; and
  (f) variable impedance means connected to said first and said second time constant elements to vary said impedance as a function of the outputs of said capacitors for controlling the gain of said amplifier means corresponding to the impedance value of said variable impedance means.

2. An automatic gain control circuit for a camera which records sound with picture comprising:
  (a) amplifier means for amplifying a received sound signal;
  (b) a first time constant circuit including a first capacitor connected to the output terminal of said amplifier means for charging the first capacitor, wherein said first time constant circuit determines a first attack time;
  (c) a first time constant element connected to said first capacitor for forming a discharge path of said first capacitor, wherein said first time constant element independently determines a first recovery time;
  (d) a second time constant circuit including a second capacitor connected to the output terminal of said amplifier means for charging the second capacitor, wherein said second time constant circuit has a time constant value greater than that of said first time constant circuit for independently determining a second attack time;
  (e) a second time constant element connected to said second capacitor for forming a discharge path of said second capacitor, said second time constant element being constructed to form a greater time constant value than that of said first time constant element for determining a second recovery time; and
  (f) variable impedance means connected to said first and said second time constant elements to vary said impedance as a function of the output of said capacitors for controlling the gain of said amplifier means corresponding to the impedance value of said variable impedance means.

3. An automatic gain control circuit for a camera which records sound with picture comprising:
  (a) amplifier means for amplifying a received sound signal;
  (b) a first time constant circuit including a first capacitor connected to the output side of said amplifier means and having an attack time associated therewith;
  (c) a second time constant circuit including a second capacitor connected to the output side of said amplifier means and having an attack time associated therewith that is shorter than the attack time of said first time constant circuit;
  (d) a first element connected to said first capacitor for determining a recovery time;
  (e) a second element connected to said second capacitor for determining a recovery time, said recovery time determined by said second element being shorter than the recovery time determined by said first element; and
  (f) variable impedance means connected to said amplifier means for controlling the gain of said amplifier means in response to the output of said capacitor.

4. An automatic gain control circuit for a camera which records sound with picture comprising:

(a) amplifier means for amplifying a received sound signal;
(b) a first control circuit having an input terminal connected to the output side of said amplifier means, and having a first element determining attack time and a second element determining a recovery time;
(c) a second control circuit having an input terminal connected in parallel with said first control circuit, and having a third element determining an attack time and a fourth element determining a recovery time, wherein said attack and recovery times determined by said third and fourth elements are shorter than attack and recovery times determined by said first and said second elements; and
(d) gain control means for controlling the gain of said amplifier means in response to the output signal produced by said first and said second control circuits, wherein each of said first, second, third and fourth elements determine the attack time and recovery time independently of each other.

5. An automatic gain control circuit according to claim 2, wherein said first time constant circuit includes a first rectifying means for rectifying the output signal from said amplifier means, and said second time constant circuit includes a second rectifying means for rectifying the output signal from said amplifier means.

6. An automatic gain control circuit according to claim 3, wherein said first time constant circuit includes a first rectifying means for rectifying the output signal from said amplifier means, and said second time constant circuit includes second rectifying means for rectifying the output signal from said amplifier means.

7. An automatic gain control circuit according to claim 2, wherein a signal shunt path is provided at the input side of said amplifier means, said path including said variable impedance means.

8. An automatic gain control circuit according to claim 3, wherein a signal shunt path is provided at the input side of said amplifier means, said path including said variable impedance means.

9. An automatic gain control circuit according to claim 4, wherein said gain control means includes variable impedance means for varying the impedance in response to the output signal from said first and second control circuits, and a signal shunt path formed by said variable impedance means is provided at the input side of said amplifier means.

10. An automatic gain control circuit according to claim 2, wherein the time constant of said first time constant circuit is smaller than the time constant value formed by said first time constant element.

11. An automatic gain control circuit according to claim 10, wherein the time constant of said second time constant circuit is smaller than the time constant value formed by said second time constant element.

12. An automatic gain control circuit according to claim 3, wherein the attack time of said first time constant circuit is shorter than the recovery time determined by said first element.

13. An automatic gain control circuit according to claim 12, wherein the attack time of said second time constant circuit is shorter than the recovery time determined by said second element.

14. An automatic gain control circuit for sound motion picture camera comprising:
(a) amplifier means for amplifying a received sound signal;
(b) a first time constant circuit including a first capacitor connected to said output terminal of said amplifier means for charging the first capacitor;
(c) a first diode connected between said first capacitor and the output terminal of said amplifier means;
(d) a first time constant element connected to said first capacitor for forming a discharge path of said first capacitor;
(e) a second time constant circuit including a second capacitor connected to said output terminal of said amplifier means for charging the second capacitor, wherein said second time constant circuit has a time constant value greater than that of said first time constant circuit;
(f) a second diode connected between said second capacitor and the output terminal of said amplifier means;
(g) a second time constant element connected to said second capacitor for forming a discharge path of said second capacitor, said second time constant element being constructed to form a greater time constant value than that of said first time constant element;
(h) variable impedance means connected to said first and said second time constant elements to vary said impedance as a function of the output of said capacitor for controlling the gain of said amplifier means corresponding to the impedance value of said variable impedance means;
(i) a third diode connected to said discharge path of said first capacitor; and
(j) a fourth diode connected to said discharge path of said second capacitor.

15. An automatic gain control circuit according to claim 2, in which a first one way conductive element is provided between said first capacitor and the output terminal of the amplifier means and a second one way conductive element is provided between said second capacitor and the output terminal of the amplifier means, further a third one way conductive element is provided at the discharge path of the first capacitor and at the same time a fourth one way conductive element is provided at the discharge path of said second capacitor.

16. An automatic gain control circuit according to claim 1, in which a first one way conductive element is provided between said first capacitor and the output terminal of the amplifier means and a second one way conductive element is provided between said second capacitor and the output terminal of the amplifier means, further a third one way conductive element is provided at the discharge path of the first capacitor and a fourth one way conductive element is provided at the discharge path of said second capacitor.

* * * * *